United States Patent [19]
Braathen

[11] Patent Number: 5,161,254
[45] Date of Patent: Nov. 3, 1992

[54] ACTIVE FILTERING MIXER

[75] Inventor: Russell E. Braathen, Calgary, Canada

[73] Assignee: NovAtel Communications, Ltd., Calgary, Canada

[21] Appl. No.: 621,359

[22] Filed: Dec. 3, 1990

[51] Int. Cl.[5] .............................. H04B 1/10
[52] U.S. Cl. .................. 455/306; 455/114; 455/310
[58] Field of Search .......... 455/295, 302–305, 455/307, 306, 323, 326, 310, 114

[56] References Cited
U.S. PATENT DOCUMENTS

| | | | |
|---|---|---|---|
| 3,939,430 | 2/1976 | Dickens et al. | 455/302 |
| 4,177,430 | 12/1979 | Paul | 455/307 |
| 4,320,523 | 3/1982 | Horikawa et al. | 455/307 |
| 4,408,352 | 10/1983 | Dudding | 455/305 |
| 5,020,148 | 5/1991 | Bonato | 455/302 |

Primary Examiner—Curtis Kuntz
Attorney, Agent, or Firm—Cesari and McKenna

[57] ABSTRACT

An active filtering mixer has a feedback arrangement, by means of which unwanted components in the output of the mixer are fed back, out of phase, to an input of the mixer for substantially canceling such components dynamically within the mixer, itself. In so doing, active filtering mixers in accordance with the invention largely avoid the undesirable effects these components can have on signal processing in downstream devices, and within the mixer. The feedback arrangement also stabilizes the mixer's DC operating point, and thereby can maintain the maximum dynamic range of the mixer. Preferably, the desired components of the output are also fed back, but to a substantially smaller degree than the unwanted components, thereby linearizing the in-band output of the mixer, and generallly improving the mixer's performance over the entire spectrum of its output.

38 Claims, 9 Drawing Sheets

ACTIVE FILTERING MIXER

FIELD OF THE INVENTION

The present invention relates to electronic circuits known as mixers, and more particularly to mixers employing feedback techniques to achieve improved operating characteristics.

BACKGROUND OF THE INVENTION

Conventional mixers are widely used in radio-telephones and other applications requiring the generation of the product of two analog waveforms or signals. It is known from trigonometry that the product is a signal at the sum and difference of the frequencies of the two input signals, i.e., the "sum and difference frequencies." The process for obtaining the product can be called mixing or multiplication.

Idealy, mixers are double balanced, single balanced or not balanced. In a double-balanced mixer, only the product of the two signals, i.e., the sum and difference frequencies, are produced. On the other hand, a single-balanced mixer produces an output containing additional components at the frequencies of one of the input signals and its harmonics. In a mixer that is not balanced, the additional components include frequencies of both input signals and their harmonics. The latter type of mixer can be implemented by applying the two signals to a non-linear device, such as, for example, a forward-biased diode, which non-linearly combines the two input signals.

Depending on the application, mixers are also known as frequency translators, modulators, synchronous detectors and phase detectors, As mentioned above, mixers are usually employed in radio-telephones, in both conventional transmitters and receivers. IN typical transmitters, e.g., mixers are used to modulate RF carriers with audio signals. In a typical receiver of a radio-telephone, for example, an incoming radio frequency ("RF") signal is mixed, i.e., combined in a mixer, with an adjustable signal from a local oscillator ("LO") to produce a signal at an intermediate frequency ("IF"). Downstream, the receiver has one or more amplifiers, filters and other components for processing and demodulating the IF signal, and thereby extracting the information it carries. Changing the LO frequency tunes the receiver to different radio frequencies.

While generally suitable for such uses, known mixers can produce products containing unwanted components at various frequencies, sometimes including a direct current ("DC") offset. The unwanted components result from interfering signals or other undesired waveforms contained within the input signals to the mixer, or from distortion introduced within the mixer itself. The unwanted components in the output of the mixer can ripple through downstream electronic devices, further distorting signals being processed, and even impairing the receiver's performance.

In addition, signal levels within the mixer can shift the DC operating point or bias of electronic devices within the mixer. A mixer is typically designed to operate at a particular DC operating point, which is selected to allow the mixer to accept a broad range of input amplitudes, i.e., a maximum or near maximum "dynamic range," with a minimum of distortion for a particular application. Any shift of the operating point can reduce its dynamic range from that optimal level and thus increase signal distortions.

Filters downstream from the mixer have been employed in the prior art to remove unwanted components of the mixer output signal outside a band of interest (i.e., "out-of-band components"). Such filters do not, however, correct distortions within the band of interest (i.e., "in-band"). Also, even though the filters can remove the out-of-band unwanted components, they do so only after the signal has already passed from the mixer, and thus the prior art filters do not prevent the untoward effects of the unwanted components within the mixer itself.

SUMMARY OF THE INVENTION

Briefly, the invention resides in a feedback arrangement of in an active filtering mixer, by means of which the unwanted components in the output of the mixer are fed back, out of phase, to an input of the mixer for substantially canceling such components dynamically within the mixer, itself. In so doing, an active filtering mixer in accordance with the invention largely avoids the undesirable affects these components can have on signal processing in downstream devices, and within the mixer. The feedback arrangement also stabilizes the mixer's DC operating point, and thereby maintains the maximum dynamic range of the mixer.

In accordance with a preferred embodiment of the invention, the desired components of the output are also fed back, but to a substantially smaller degree than the unwanted components, thereby linearizing the in-band portion of the output of the mixer with respect to the input signals, and generally improving the mixer's performance over the entire spectrum of its output.

BRIEF DESCRIPTION OF THE DRAWINGS

The aforementioned aspects, features and advantages of the invention, as well as others, are explained in the following description taken in connection with the accompanying drawings, wherein.

DESCRIPTION OF THE PREFERRED EMBODIMENT

Figure 1:
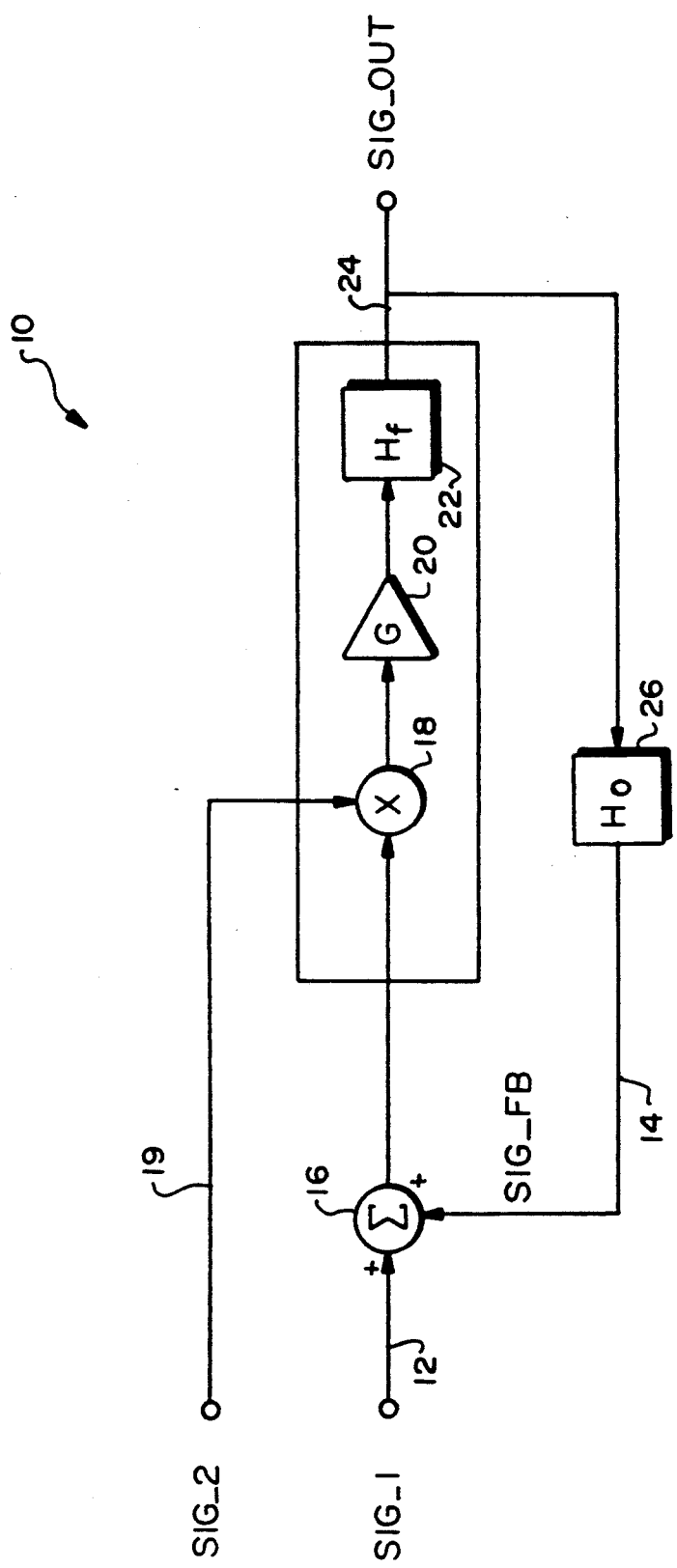
FIG. 1 is a block diagram of an active, filtering mixer in accordance with a preferred embodiment of the invention.

FIG. 1 shows an active filtering mixer 10 in accordance with an illustrative embodiment of the invention. In that drawing, a first input signal SIG_1, which is received over input line 12, and a feedback signal SIG_FB, which is received over feedback line 14, are fed to a summer 16, where they are added and the sum applied to a multiplier 18.

The multiplier 18 multiplies the sum by a second input signal SIG_2, which is received over line 19, and, in so doing, performs the actual mixing of the two signals [SIG__1+SIG__FB]×SIG __2. The resulting product is provided to an amplifier 20, where it is amplified with a gain G. A filter 22 having a transfer characteristic of $H_f$ filters the amplified signal to produce an output signal SIG__OUT. This output signal is applied both to an output line 24 and to a feedback arrangement, including feedback element 26. The feedback element 26 filters and, for certain applications, amplifies the output signal SIG__OUT to produce SIG__FB on line 14. The feedback element 26 has a transfer characteristic $H_o$.

The output of the multiplier 18 can be considered to have a desired component and, superimposed thereon, an unwanted component. The feedback signal SIG__FB generated in feedback element 26 is a function of these signal components, and a function of $H_o$, G and $H_f$.

In accordance with the invention, application of the feedback SIG__FB to the multiplier input causes the unwanted component of its output to be largely suppressed. One can regard this as the result of the multiplier 18, in response to the feedback signal SIG-FB, not producing the unwanted component in its output. Alternatively, and, for many, an easier way to view this result, is to think of the feedback signal SIG__FB as causing the multiplier 18 to generate, in its output, a cancellation signal that substantially cancels (or, at least, largely suppresses) the unwanted component also present in its output. Either way, the unwanted component is suppressed and the desired signal remains generally unchanged, or is even linearized (as described below).

Using the latter view of the operation of the multiplier 18, the cancellation signal for many mixer applications has (i) essentially the same amplitude and the opposite polarity of unwanted "near-DC" components (as defined below), and (ii) essentially the same amplitude and frequencies as signal components above the band-of-interest (e.g., higher frequency components), but a phase which is 180 degrees out of synchronization with those components. To obtain the required reversal of phase for feedback signal SIG__FB, for example, the product of G of amplifier 20, $H_f$ of filter 22, and $H_o$ of feedback element 26 must be negative. The cancellation signal will thus combine with, and substantially cancel, the unwanted component having frequencies above and below the band-of-interest.

Since complete cancellation of the unwanted component is difficult to achieve in many applications, the cancellation signal typically does not completely cancel the unwanted components, though such components are attenuated so to have minimal effect.

It will also be recognized by those skilled in the art, that signals other than those mentioned above, e.g., interfering signals due to non-linear effects of electronic components up-stream of the mixer or adjacent-frequency interference in cellular radio-telephone applications, can also appear in the output of the multiplier 18. These, too, will be suppressed in the preferred embodiment of the invention.

Illustrative Implementation of Preferred Embodiment

Figure 2A:
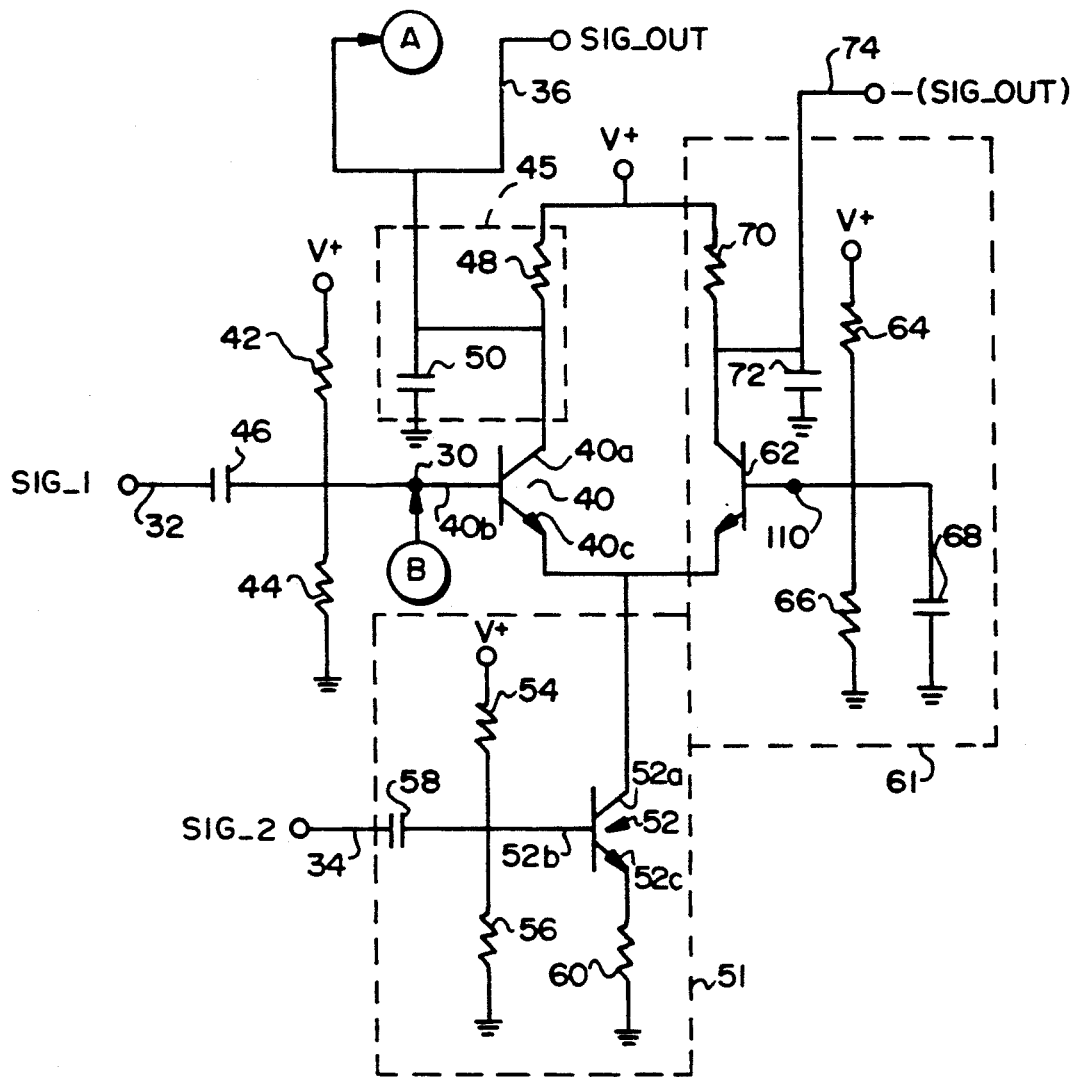
FIGS. 2a and 2b, together, show a schematic diagram of an implementation of the embodiment of FIG. 1.

FIG. 2a shows a schematic view of a preferred implementation of the invention. The summer 16 (FIG. 1) appears in this drawing as node 30, input line 12 (FIG. 1) for SIG__1 is shown at 32, input line 14 (FIG. 1) for SIG__2 is shown at 34, and output line 24 (FIG. 1) is shown at 36. In a typical application, either SIG__1 or SIG__2 is an RF signal, and the other is a modulating signal.

The multiplier 18 (FIG. 1) and amplifier 20 (FIG. 1) are depicted as a bi-polar transistor 40, having a collector 40a, base 40b and emitter 40c. Resistors 42, 44 connected respectively between a voltage source v+ and the base 40b, and between the base 40b and ground, provide the bias for transistor 40. Capacitor 46 acts as a DC block which allows the bias point on the transistor 40 to be established by resistors 42, 44.

Filter 22 (FIG. 1) appears as a sub-circuit 45 including, for instance, a collector resistor 48, which is connected between collector 40a and the voltage source v+, and a collector capacitor 50, which is connected between collector 40a and ground. The output line 36 is connected to collector 40a.

Also shown in FIG. 2a is a constant current source 51, in which a constant-amplitude current is modulated with SIG__2, e.g., the output of a local oscillator (not shown), and applied to emitter 40c. More specifically, current source 51 includes a transistor 52, with collector, base and emitter electrodes 52a, 52b, and 52c. Biasing resistors 54, 56 and a DC blocking capacitor 58 are also provided, and connected as described above with reference to resistors 42, 44, capacitor 46 and transistor 40.

In addition, an emitter resistor 60 is connected between emitter 52c and ground. The voltage drop across resistor 60 is equal to the voltage on line 34 minus the emitter-base drop of transistor 52. As SIG__2 varies, the current through resistor 60 changes. As a result, the current applied by the current source 51 to transistor 40 is modulated by SIG__2.

FIG. 2a further shows a symmetrical load circuit 61, which provides a substantially constant load impedance for the multiplier 40. The load circuit 51 is shown as a mirror image version of the circuit described in conjunction with transistor 40. Specifically, load circuit 61 has a transistor 62, biasing resistor 64, 66, capacitor 68, collector resistor 70 and collector capacitor 72 arranged as described above for transistor 40 and its associated devices 42 through 50, except that capacitor 68 is connected between the base of transistor 62 and ground for removing high frequency components from the base. The emitter of transistor 62 is connected to emitter 40c of transistor 40 and the collector 52a of transistor 52. The output of the load circuit 61 on line 74 is the negative of SIG__OUT.

The operation of the circuit of FIG. 2a as described so far will now be explained. (It should be noted that, at this point in the discussion, the feedback arrangement shown in FIG. 2b has not yet been introduced.)

The mixing action of SIG__1 and SIG__2 in the circuit of FIG. 2a occurs in transistor 40. SIG__1 creates a voltage across the base-emitter junction ($V_{BE}$) of transistor 40, and thereby controls the current flowing through the transistor 40. SIG__2 modulates (e.g., turns on and off) the current through transistor 52 of the current source 51. As the current in transistor 52 changes, $V_{BE}$ of transistor 40 changes, yielding non-linearities in its operating characteristics due to shifts in its DC operating point. These non-linearities achieve the mixing action.

The output voltage SIG__OUT depends on the gain G of transistor 40, which, by definition, equals the change of voltage across transistor 40 divided by the change in $V_{BE}$ of that transistor. The amplitude of $V_{BE}$ for transistor 40 is a function of the current flowing through transistor 40, and the bias on transistor 40. The resistors 42 and 44 set the bias by establishing a quiescence point for transistor 40. The quiescence point is the point along its operating curves at which transistor 40 operates, i.e., the DC operating point, when the input signals are zero.

The desired mixing action when the signals SIG_1 and SIG_2 are present is due, in other words, to shifting of this DC operating point. Such shifting of the operating point is thus necessary to the operation of the mixer in obtaining the desired product of the two input signals. Unfortunately, the DC operating point is sometimes shifted for other reasons as well, causing the above-described difficulties in the mixer and its output.

The transfer characteristics of the filter sub-circuit 45 of FIG. 1 can also be expressed in terms of the illustrated components, to wit, as the product of the resistance of resistor 48 and the capacitance of capacitor 50. The resistor 48 and capacitor 50 approximate an ideal current source controlled by the base current in transistor 40. The current through resistor 48 and capacitor 50 is converted into a voltage by those devices. That voltage has a desired frequency dependence, which has been described in terms of the filter transfer characteristic $H_f$.

As mentioned above, the mixer in accordance with the invention employs a feedback loop arrangement to generate a suitable feedback signal from SIG_OUT for substantially causing the cancellation of the unwanted components of the multiply output, as will now be described with additional reference to FIG. 2b.

Feedback Arrangement

Figure 2B:
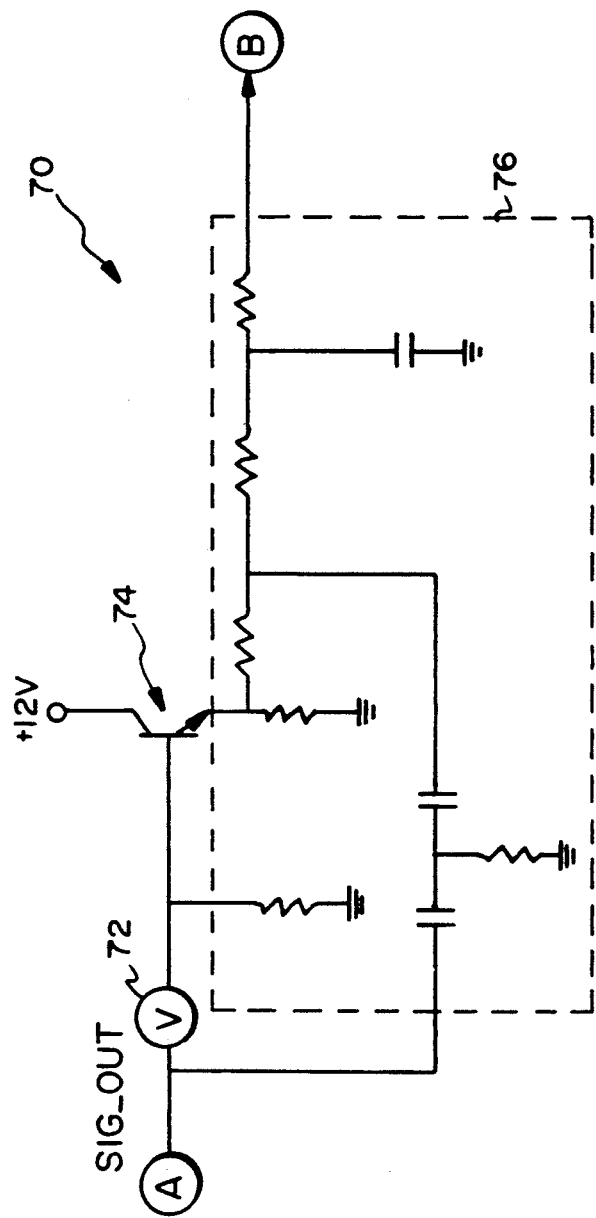

FIG. 2b shows a feedback arrangement 70, which receives and filters SIG_OUT to produce feedback signal SIG_FB. This signal, when applied to transistor 40, will suppress the unwanted components. The reversal of sign for this negative feedback signal is provided in the depicted implementation by transistor 40.

The output signal SIG_OUT is provided from point A in FIG. 2a to the feedback arrangement 70, and more particularly to a voltage source 72. Voltage source 72 provides a voltage drop, such as can be achieved by a plurality of serially connected diodes (not shown). The voltage source 72 is connected to a voltage-follower or pull-down transistor 74 to provide a low output impedance. Transistor 74 preferably matches transistor 40, and lightly loads its collector 40a. A resistor/capacitor network 76 provides a filtering function, which passes the frequencies which are to be attenuated, and blocks those frequencies which are desired in SIG_OUT. The feedback signal SIG_FB thus formed is applied to point B in FIG. 2a at node 30 at the base 40b of transistor 40.

The transfer characteristics $H_o$ of the feedback arrangements 70 are determined by approximating the gains of the mixer at various frequencies, and designing the feedback arrangement 70 as a band-reject filter for substantially not passing or, at least, substantially attenuating a selected band of frequencies, while substantially passing frequencies on either side of the reject band. Alternatively, the band reject filter can be formed by the combination of the feedback arrangement 70 and the filter sub-circuit 45. In this latter arrangement, since $H_f$ of the filter sub-circuit 45 typically provides low-pass filtering, the feedback arrangement 70 need provide only high-pass filtering.

Figure 3:
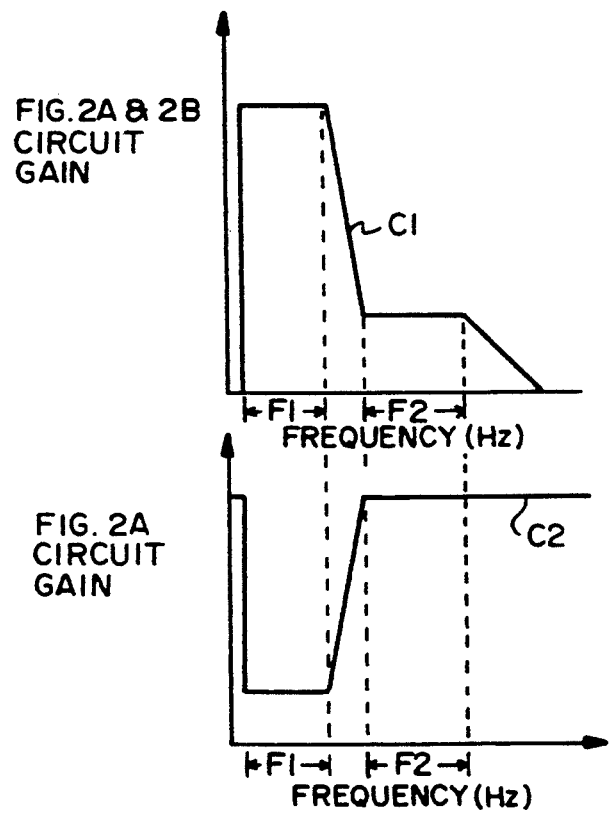
FIG. 3 is a graph plotting the gain of the circuit shown in FIGS. 2a and 2b versus frequency in curve C1, and the gain of the feedback circuit of FIG. 2b versus frequency in curve C2.

FIG. 3 shows a graph on which gain is plotted against frequency for the entire circuit of FIG. 2a resulting in curve C1, and for just the feedback circuit of FIG. 2b resulting in curve C2. These curves C1, C2 show the transfer characteristics for the respective circuits.

As can readily be seen from the graph, curve C1 exhibits a zero gain for "near zero frequencies" or "near DC", then steps up to a high gain over a first range F1 of frequencies (which can be regarded as the frequencies of interest or in-band frequencies), before rolling off to a lower gain for a higher range F2 of frequencies, and, rolling off again to zero gain for still higher frequencies. The terms "near-zero" frequencies and "near DC" mean frequencies less than about half of the lowest of the frequencies of interest. Thus, for example, where the in-band frequencies are 200 Hz to 10 KHz, near-zero frequencies are those below 100 Hz.

In achieving this frequency response for the entire circuit, the transfer characteristics of the feedback circuit play an important role. Curve C2 exhibits a high gain at near-zero frequencies, a low gain in frequency range F1 so as to provide low attenuation in that range, and then a high gain again in a higher range of frequencies, including frequency range F2, so as to provide high attenuation over that range.

As can be seen from the curves, the frequencies of interest in range F1 are also fed back, but with a lower gain than that of out-of-band frequencies (i.e., signals at near-DC and in range F2). This causes the in-band component of the mixer output signal to be substantially linearized with respect to the input signals to the mixer.

Alternative Embodiments

Figure 4A:
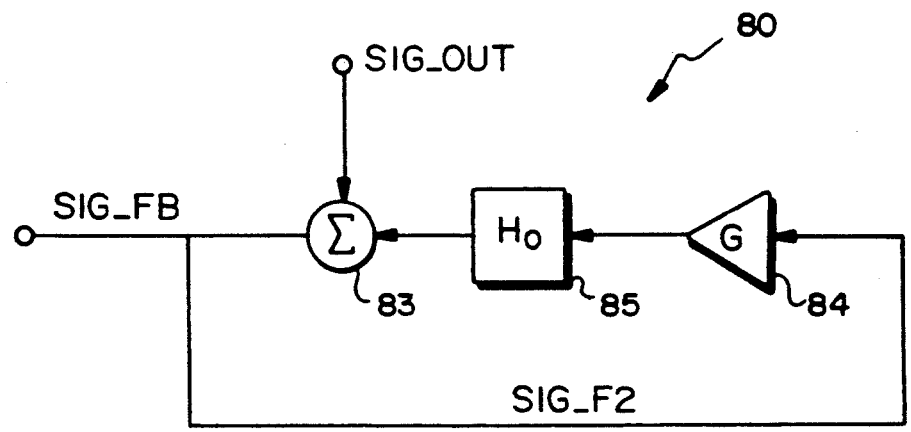
FIGS. 4a and 4b are alternative implementations of the feedback arrangement of FIG. 2.
Figure 4B:
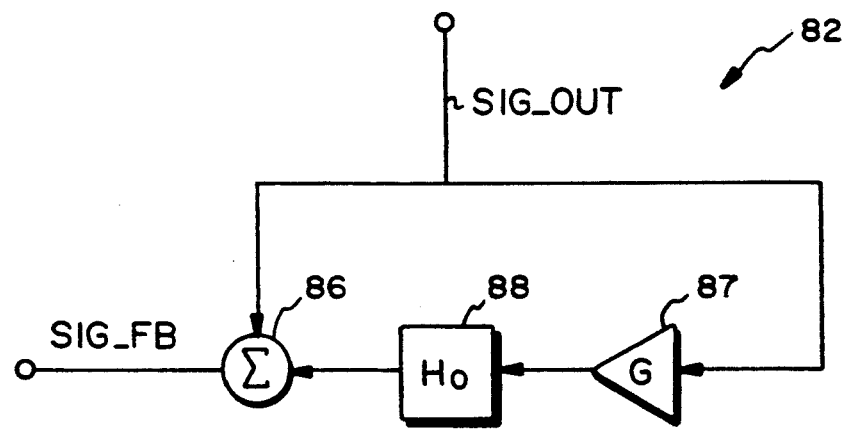

The feedback arrangement 70 of FIG. 2b can be implemented alternatively in other ways, for instance, as a minor feedback loop 80 as shown in FIG. 4a or as a minor feedforward loop 82 as shown in FIG. 4b. In FIG. 4a, SIG_OUT and a second feedback signal SIG_F2 are applied to a summer 83, and the resulting sum is SIG_FB. Unlike the version described above, however, SIG_FB is applied not only to summer 16 (FIG. 1) but also to an amplifier 84. The amplified version is applied to filter 85, which operates in the manner of feedback arrangement 70. The output of filter 85 is SIG_F2.

In FIG. 4b, SIG_OUT is applied both to a summer 86 as a first input and to an amplifier 87. The amplified signal is filtered in filter 88 before being applied to the summer 86 as a second input. The output of the summer 86 is SIG_FB.

The arrangements of FIGS. 4a and 4b minimize the potential for phase shifts on out-of-band signals so as to assure that the cancellation signal at those frequencies is 180 degrees out of phase with the components to be canceled.

Figure 5:
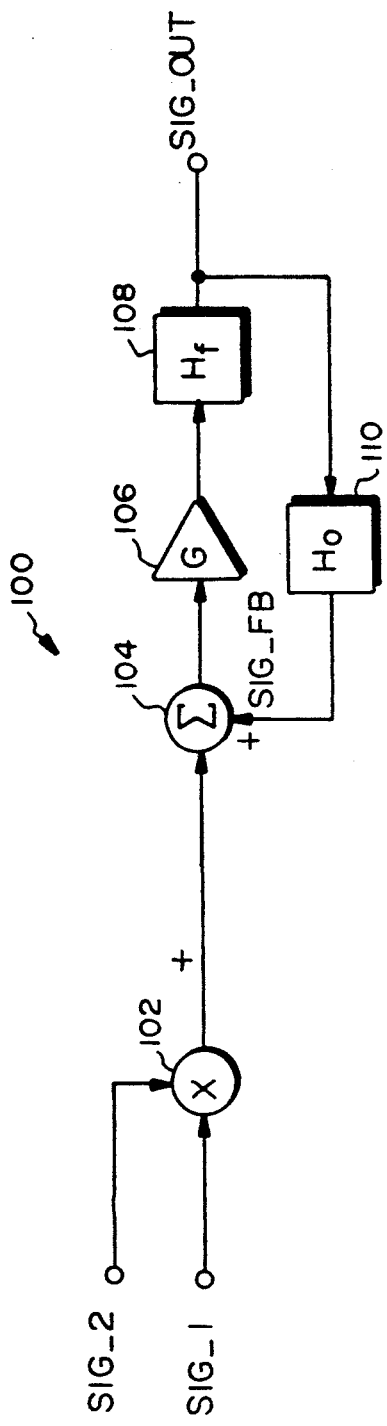
FIG. 5 through 8, inclusive, are block diagrams of alternative embodiments of the invention.

FIG. 5 shows a mixer 100 in accordance with an alternative embodiment of the invention, in which the feedback signal is provided to a different location in the circuit. In mixer 100, SIG_1 and SIG_2 are provided to a multiplier 102, and the product is added to a negative feedback signal SIG_FB in a summer 104, before being amplified in amplifier 106 and filtered in filter 108 to form SIG_OUT. SIG_OUT is applied to feedback element 110 to form SIG_FB.

Mixer 100 can be implemented with the circuit shown in FIG. 2a and 2b, except that, instead of providing the feedback signal SIG_FB at node 30, it is provided, for example, at node 110 at the base 62b of transistor 62.

This arrangement of FIG. 5 provides a variable load that limits unwanted excursions in the output of the multiplier 102, and, in other words, causes the unwanted components to be cancelled.

In FIG. 5, since SIG_FB is fed back to a point downstream of the multiplier 102, mixer 100 can be double-balanced or single-balanced by appropriate tailoring of the filtering characteristics of filter 108 and feedback element 110 so as to control the content of SIG_OUT.

As described above, in a double-balanced mixer, only the product of SIG_1 and SIG_2, i.e., the sum and difference frequencies, are produced. On the contrary, a single-balanced mixer produces an output containing additional components at the frequencies of either SIG_1 or SIG_2, and its harmonics. On the other hand, in a mixer that is not balanced, the additional components include frequencies of both input signals and their harmonics.

Mixer 100 can viewed another way: the addition of feedback element 110 as shown in this drawing can convert a mixer which is not balanced, for example, into a single or double balanced mixer, or convert a single balanced mixer into a double-balanced mixer. As can be appreciated, such mixers have advantages in many applications.

Figure 6:
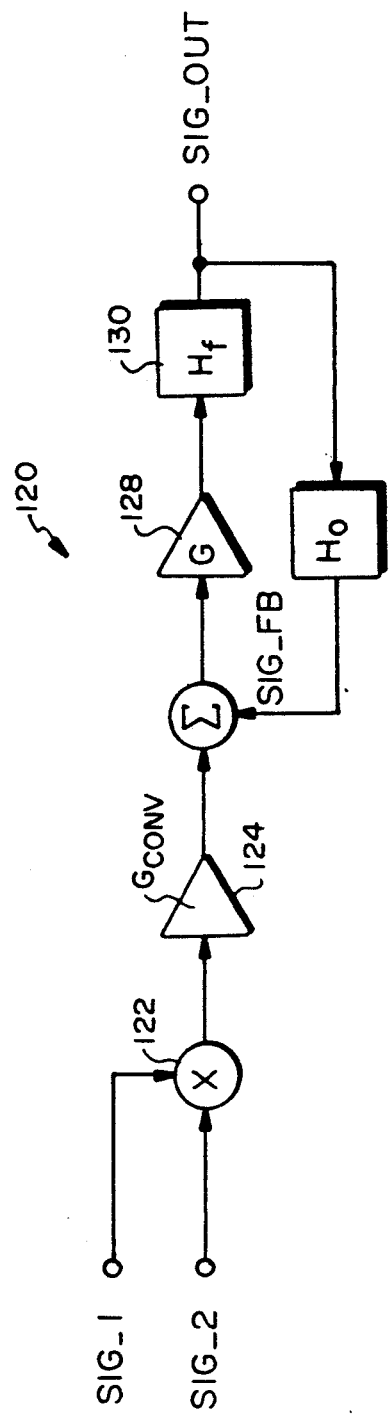

FIG. 6 shows a mixer 120 in accordance with a further embodiment of the invention. Here, SIG_1 and SIG_2 are multiplied by a multiplier 122, and then amplified with a gain $G_{conv}$ in amplifier 124, before being combined with SIG_FB in a summer 126. The output of the summer 126 is amplified with a gain G in amplifier 128, and filtered in filter 130 to form SIG_OUT. SIG_OUT is applied to feedback element 132 to form SIG_FB. Mixer 120 can be implemented as diode ring mixer.

Figure 7:
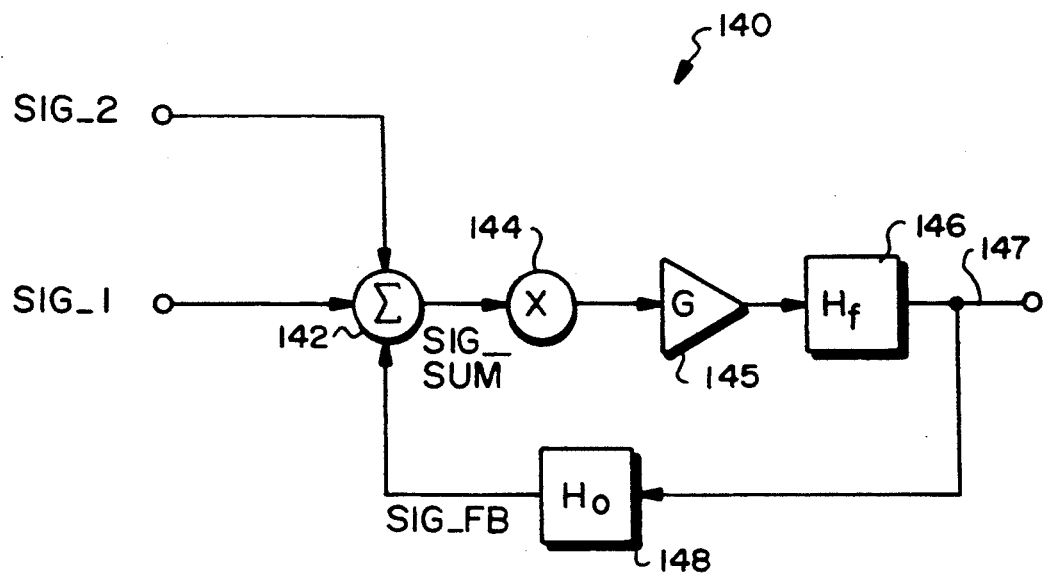

FIG. 7 shows a mixer 140 in accordance with still another embodiment of the invention. Mixer 140 has a three-port summer 142, which adds a first input signal SIG_1, a second input signal SIG_2, and a feedback signal SIG_FB. The mixer 140 also has a multiplier 142, which, in this case, is a non-linear electronic device, such as, for example, a diode or transistor, which receives the output from the summer 142, i.e., SIG_SUM.

As a non-linear device, the multiplier 142 has a non-linear operating characteristic, which can be visualized as a non-linear curve on a graph of output verses input for the device. The multiplier 142, receives SIG_SUM from the summer 142, operates at a point along its operating curve dependent on the amplitude of SIG_SUM, which, in turn, is dependent on the amplitudes of the three input signals to summer 142, i.e., SIG_1, SIG_2, and SIG_FB.

The output of multiplier 144 is amplified with gain G in amplifier 145, filtered in filter 146, and provided to both an output line 148 and a feedback element 148 for generating SIG_OUT, all as described above with reference to FIG. 1.

Figure 8:
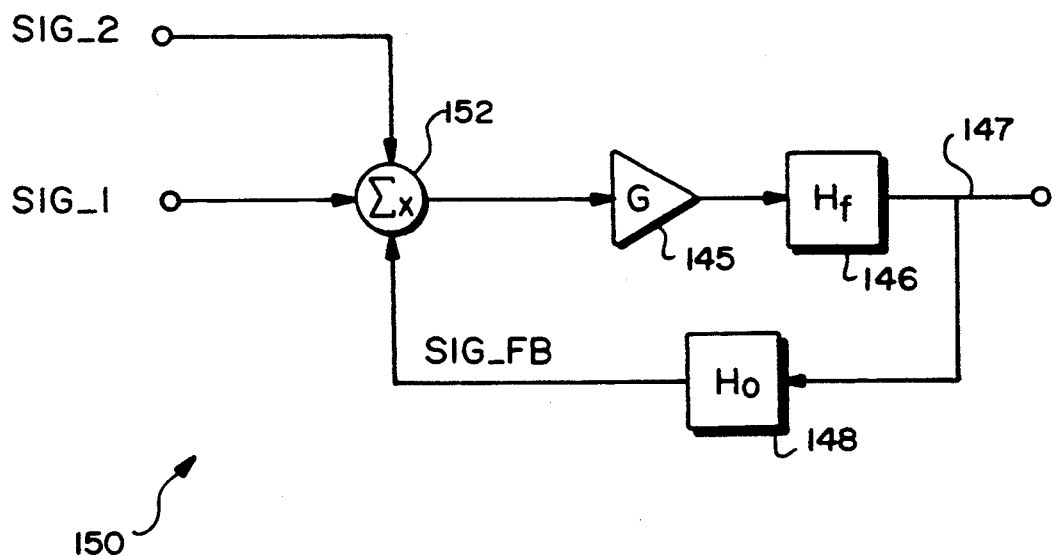

FIG. 8 depicts yet another embodiment of the invention, in which a mixer 150 employs a non-linear summation device 152, e.g., a forward biased diode (not shown), to which SIG_1, SIG_2, and SIG_FB are applied. The summation device 152 modifies the amplitude of SIG_1 in accordance with the amplitude of SIG_2 and SIG_FB. The output of summation device 152 is fed to an amplifier, filter and feedback element, which, for convenience and brevity in description, bear the same reference numbers as in, and operate in accordance with the explanation given for, FIG. 7. Where the summation device 152 is a diode, for example, all three signals, i.e., SIG_1, SIG_2, and SIG_FB, are applied to the anode, and the output is taken across a load (not shown) connected to the cathode.

Radio-Telephones Using Active Filtering Mixers

Figure 9:
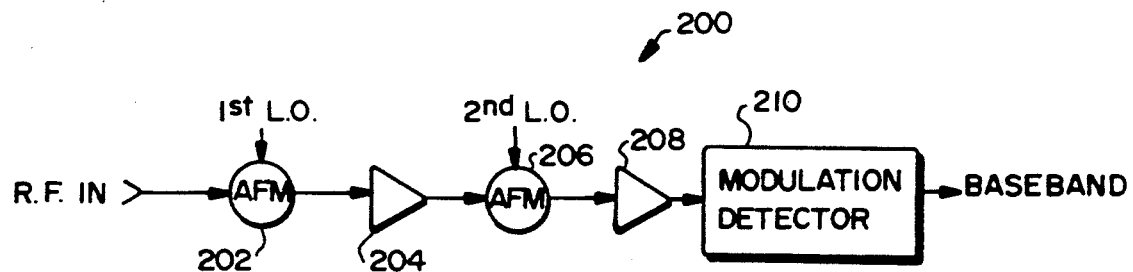
FIG. 9 through 13, inclusive, are block diagrams depicting alternative embodiments of radio-telephones in accordance with the invention.

In accordance with the invention, mixers 10, 100, or 120 can be incorporated in a variety of electronic circuits such as the radio telephones illustrated in FIGS. 9 through 13. In FIG. 9 a radio telephone receiver 200 has a first mixer 202, which receives a radio frequency (RF) input signal and a first LO signal forming a first IF signal. This signal can, if desired, be amplified by amplifier 204 before being fed to a second mixer 206. The second mixer 206 is preferably implemented as an active, filtering mixer, as described above. In addition to the output from the amplifier 204, the second mixer 206 receives a second LO signal and produces a second IF signal. This signal can be amplified in a second amplifier 208 before being passed to a modulation detection circuit 210 for producing a baseband signal. Those skilled in the art will recognize the receiver 200 as being a double converting unit.

Figure 10:
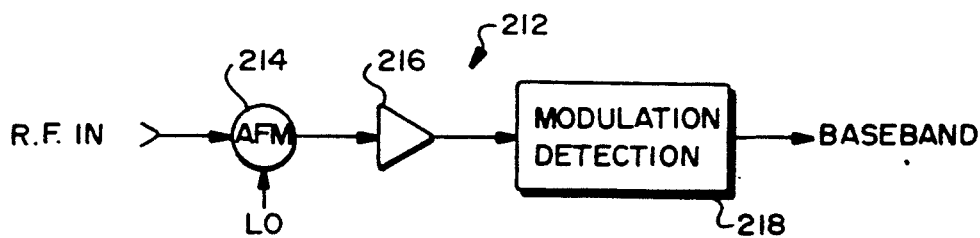

FIG. 10 shows a single converting receiver 212, in which a single mixer 214, preferably an active filtering mixer 212 receives an RF input and an LO input signal. The output from mixer 214 is provided to an amplifier 216 and the amplified signal is then fed to a modulation detection circuit 218 for generation of a baseband signal.

Figure 11:
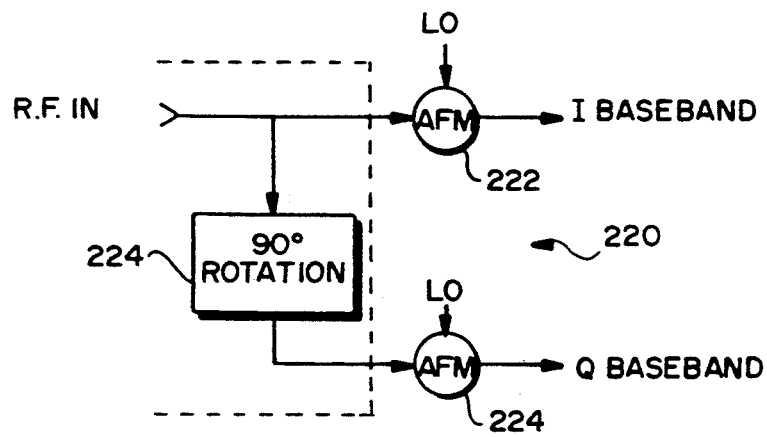
Figure 12:
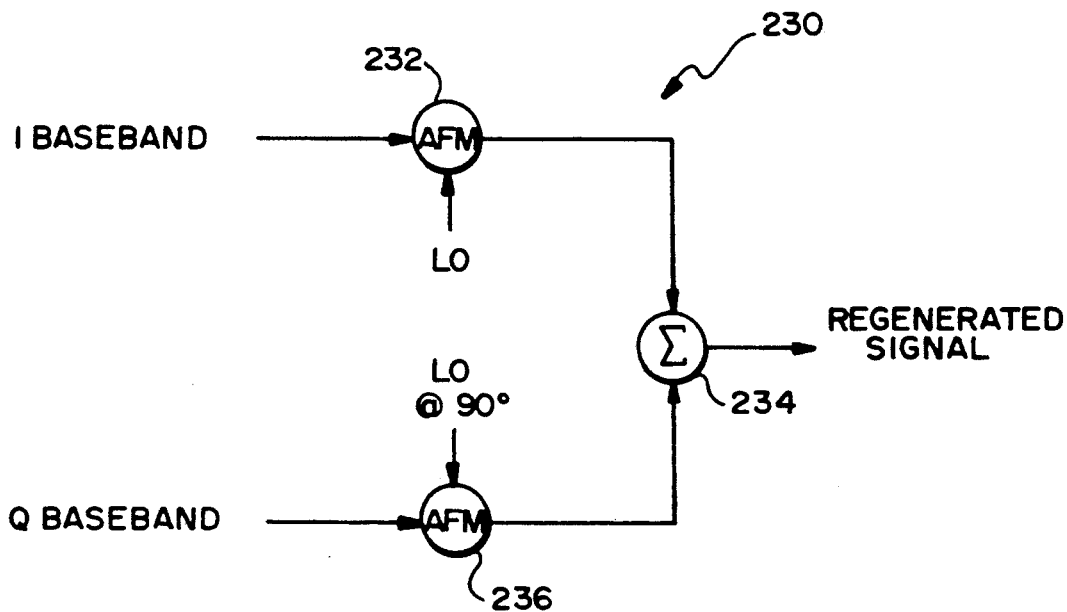

FIGS. 11 and 12 show quadrature detecting receivers 220, 230. The receiver 220 of FIG. 11 provides an RF input signal to a first mixer, preferably implemented as an active filtering mixer 222, which also receives an LO input signal and produces an I (in phase) baseband signal. The RF input signal is also provided to a device 224 for rotating its phase by 90 degrees, and the output from that device is provided to a second mixer, which preferably is also implemented as an active filtering mixer 224. The second mixer receives an LO input signal and produces a Q (quadrature) baseband signal.

The circuit 230 of FIG. 12, as noted above, can be considered a quadrature detection receiver stage or, as those skilled in the art will recognize, can also be regarded as a quadrature modulating stage of a transmitter. In circuit 230, an I baseband signal is provided to a first, preferably active filtering mixer 232, which also receives an LO input, and feeds its output to a summer 234. A Q baseband signal is provided to a second, preferably active filtering mixer 236, which also receives the LO signal after its phase has been rotated by 90 degrees, and delivers its output also to the summer 234. This summer 234 adds the two outputs from the mixers 232, 236, producing either a generated signal or a regenerated signal depending on whether the circuit is used in a receiver or a transmitter.

Figure 13:
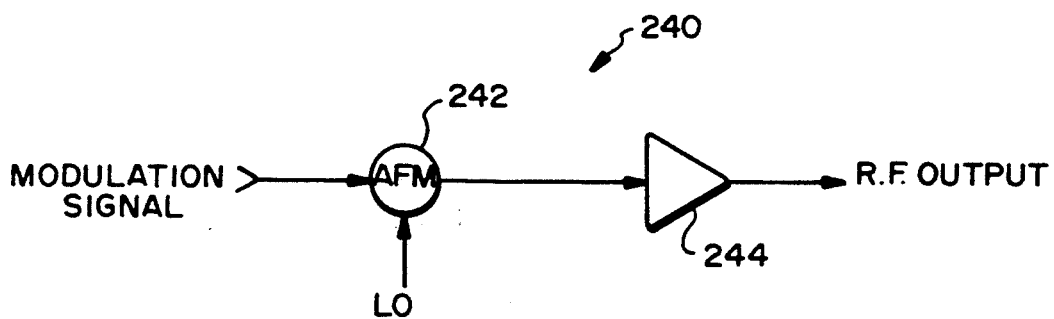

FIG. 13 shows a receiver 240, in which a modulation signal is provided to a preferably active filtering mixer 242 which also receives an LO input signal. The output from the mixer 242 can be amplified by amplifier 244 to produce an output at a pre-selected high frequency (e.g., RF) range.

The foregoing embodiments of the invention have been implemented using bi-polar transistor technology. Those skilled in the art will recognize that the invention can be otherwise implemented, for example, using field effect transistors.

Although certain preferred embodiments have been shown and described, it should be understood that many changes and modifications may be made therein without departing from the scope of the appended claims.

What is claimed is:

1. An active filtering mixer comprising:
   A) means for multiplying a first input signal and a second input signal to produce a mixer output signal, said mixer output signal having an unwanted first component and a wanted second component; and
   B) feedback means coupled with said multiplying means for supplying thereto, out of phase, said unwanted first component as a feedback signal derived from said mixer output signal;
   C) said multiplying means being responsive to said feedback signal for attenuating said unwanted first component of said mixer output signal dynamically within said mixer, thereby reducing the effects within said multiplying means of said unwanted first component, and reducing mixer-generated distortion in said mixer output signal.

2. The mixer in accordance with claim 1, wherein said feedback means is coupled with said multiplying means for supplying thereto, out of phase and to a smaller degree than said unwanted first component, said wanted second component as a linearizing component of said feedback signal, said linearizing component being derived from said mixer output signal, and wherein said multiplying means is responsive to said linearizing component for linearizing a selected frequency band of said mixer output signal with respect to said first and second input signals.

3. The mixer in accordance with claim 1, wherein, in response to said feedback signal, said multiplying means generates a cancellation signal for canceling said first component of said output signal.

4. The mixer in accordance with claim 1, wherein said multiplying means is responsive to said feedback signal for suppressing said first component in frequencies above and below a selected frequency range.

5. The mixer in accordance with claim 1, wherein said multiplying means is responsive to said feedback signal for suppressing said first component in at least near-DC frequencies.

6. The mixer in accordance with claim 1 wherein said multiplying means is responsive to said feedback signal for linearizing the mixer output in a selected frequency range with respect to said first and second input signals while suppressing the mixer output outside said selected frequency range.

7. An active filtering mixer comprising:
   A) summer means for adding a first input signal and a mixer feedback signal to produce a sum signal;
   B) multiplier means coupled with said summer means for multiplying said sum signal by a second input signal, thereby mixing said first and second input signals and producing a multiplier output signal;
   C) amplifier means coupled with said multiplier means for amplifying said multiplier output signal with a gain G;
   D) first filter means coupled with said amplifier means and having a transfer characteristic $H_f$ for filtering said amplified multiplier output to produce a mixer output signal applied to a mixer output line, said mixer output signal comprising a wanted component and an unwanted component; and
   E) second filter means coupled with said first filter means and said summer means, and having a transfer characteristic $H_o$, for filtering said mixer output signal to produce said mixer feedback signal and applying said mixer feedback signal to said summer means; and
   F) wherein said amplifier means and first and second filter means cause said mixer feedback signal to be of an amplitude, frequency and phase that attenuates said unwanted component in said mixer output signal.

8. The mixer in accordance with claim 7, wherein said wanted component falls within a pre-selected frequency band, and said unwanted component comprises an unwanted, near-DC component, and an unwanted component outside said pre-selected band; and wherein said G, $H_f$, and $H_o$ are selected such that said mixer feedback signal comprises:
   (i) approximately the same amplitude as, and approximately opposite polarity from that of, said unwanted near-DC component, and
   (ii) approximately the same amplitude and approximately the same frequency as said unwanted component outside said pre-selected band, and a phase that is about 180° out of synchronization therewith.

9. The mixer in accordance with claim 7, wherein the product of G, $H_f$, and $H_o$ is negative.

10. The mixer in accordance with claim 7, wherein said mixer feedback signal cancels said unwanted component.

11. The mixer in accordance with claim 7, wherein said second filter means comprises a band-reject filter.

12. The mixer in accordance with claim 7, wherein said first filter means comprises a low-pass filter and said second filter means comprises a high-pass filter.

13. The mixer in accordance with claim 7, wherein said second filter means comprises:
   A) second summer means coupled with said first filter means for adding said mixer output signal and a second feedback signal to produce said mixer feedback signal;
   B) second amplifier means coupled with said second summer means for amplifying said mixer feedback signal to produce a second amplifier signal; and
   C) third filter means coupled with said second amplifier means for filtering said second amplifier signal to produce said second feedback signal.

14. The mixer in accordance with claim 7, wherein said second filter means comprises:
   A) second amplifier means coupled with said first filter means for amplifying said mixer output signal to produce a second amplifier signal;
   B) third filter means coupled with said second amplifier means for filtering said second amplifier signal to produce a second feedback signal; and
   C) second summer means coupled to said first filter means and said third filter means for adding said mixer output signal and said second feedback signal to produce said mixer 15. An active filtering mixer comprising:
   A) multiplier means for multiplying first and second input signals to produce a multiplier output signal;
   B) summer means coupled with said multiplier means for adding said multiplier output signal and a mixer feedback signal to produce a sum signal;
   C) amplifier means coupled with said summer means for amplifying said sum output signal with a gain G to produce an amplified sum signal;
   D) first filter means coupled with said amplifier means and having a transfer characteristic $H_f$ for filtering said amplified sum signal to produce a mixer output signal applied to a mixer output line, said mixer output signal comprising a wanted component and an unwanted component; and E) second filter means coupled with said first filter means and said summer means, and having a transfer characteristic $H_o$, for filtering said mixer output signal to produce said mixer feedback signal and applying said mixer feedback signal to said summer means; and F) wherein said amplifier means and first and second filter means cause said mixer feedback signal to be of an amplitude, frequency and phase that attenuates said unwanted component in said mixer output signal.

16. The mixer in accordance with claim 15, wherein said wanted component falls within a pre-selected frequency band, and said unwanted component comprises an unwanted, near-DC component, and an unwanted component outside said pre-selected band; and wherein said G, $H_f$, and $H_o$ are selected such that said mixer feedback signal comprises:
 (i) approximately the same amplitude as, and approximately opposite polarity from that of, said unwanted near-DC component, and
 (ii) approximately the same amplitude and approximately the same frequency as said unwanted component outside said pre-selected band, and a phase that is about 180° out of synchronization therewith.

17. The mixer in accordance with claim 15, wherein the product of G, $H_f$, and $H_o$ is negative.

18. The mixer in accordance with claim 15, wherein said mixer feedback signal cancels said unwanted component.

19. The mixer in accordance with claim 15, wherein $H_f$, and $H_o$ are selected to render said mixer double balanced, whereby said mixer output signal comprises the sum and difference of said first and second input signals without harmonics of either.

20. The mixer in accordance with claim 15, wherein $H_f$, and $H_o$ are selected to render said mixer single balanced, whereby said mixer output signal comprises the sum and difference of said first and second input signals and harmonics of one of said first and second input signals.

21. A doubled-balanced mixer comprising:
A) a single-balanced mixer including
 (i) multiplier means for multiplying first and second input signals to produce a multiplier output signal;
 (ii) summer means coupled with said multiplier means for adding said multiplier output signal and a mixer feedback signal to produce a sum signal;
 (iii) amplifier means coupled with said summer means for amplifying said sum output signal with a gain G to produce an amplified sum signal; and
 (iv) first filter means coupled with said amplifier means and having a transfer characteristic $HJ_f$ for filtering said amplified sum signal to produce a mixer output signal applied to a mixer output line, said mixer output signal comprising the sum and difference of said first and second input signals and harmonics of one of said first and second input signals; and
B) means for converting said single-balanced mixer into a double balanced mixer comprising second filter means coupled with said first filter means and said summer means, and having a transfer characteristic $H_o$, for filtering said mixer output signal to produce said mixer feedback signal and applying said mixer feedback signal to said summer means; and C) wherein said G, $H_f$, and $H_o$ are selected such that said mixer feedback signal has approximately the same amplitude and approximately the same frequency as the harmonics in said mixer output signal, and a phase that is about 180° out of synchronization therewith; whereby said mixer feedback signal attenuates said harmonics of said mixer output signal, and whereby said mixer is double balanced.

22. A double-balanced mixer comprising:
A) a non-balanced mixer including
 (i) multiplier means for multiplying first and second input signals to produce a multiplier output signal;
 (ii) summer means coupled with said multiplier means for adding said multiplier output signal and a mixer feedback signal to produce a sum signal;
 (iii) amplifier means coupled with said summer means for amplifying said sum output signal with a gain G to produce an amplified sum signal; and
 (iv) first filter means coupled with said amplifier means and having a transfer characteristic $H_f$ for filtering said amplified sum signal to produce a mixer output signal applied to a mixer output line, said mixer output signal comprising the sum and difference of said first and second input signals and harmonics of both of said first and second input signals; and
B) means for converting said non-balanced mixer into a double-balanced mixer comprising second filter means coupled with said first filter means and said summer means, and having a transfer characteristic $H_o$, for filtering said mixer output signal to produce said mixer feedback signal and applying said mixer feedback signal to said summer means; an d
C) wherein said G, $H_f$, and $H_o$ are selected such that said mixer feedback signal has approximately the same amplitude and approximately the same frequency as the harmonics in said mixer output signal, and a phase that is about 180° out of synchronization therewith; whereby said mixer feedback signal attenuates said harmonics in said mixer output signal, and whereby said mixer is double balanced.

23. A single-balanced mixer comprising:
A) a non-balanced mixer including
 (i) multiplier means for multiplying first and second input signals to produce a multiplier output signal;
 (ii) summer means coupled with said multiplier means for adding said multiplier output signal and a mixer feedback signal to produce a sum signal;
 (iii) amplifier means coupled with said summer means for amplifying said sum output signal with a gain G to produce an amplified sum signal; and
 (iv) first filter means coupled with said amplifier means and having a transfer characteristic $H_f$ for filtering said amplified sum signal to produce a mixer output signal applied to a mixer output line, said mixer output signal comprising the sum and difference of said first and second input signals and harmonics of both of said first and second input signals; and B) means for converting said non-balanced mixer into a single-balanced mixer comprising second filter means coupled with said first filter means and said summer means, and having a transfer characteristic $H_o$, for filtering said mixer output signal to produce said mixer feedback signal and applying said mixer feedback signal to said summer means; and C) wherein said G, $H_f$, and $H_o$ are selected such that said mixer feedback signal has approximately the same amplitude and approximately the same frequency as the harmonics in said mixer output signal, and a phase that is about 180° out of synchronization therewith; whereby said mixer feedback signal attenuates said harmonics in said mixer output signal, and whereby said mixer is single balanced.

24. An active filtering mixer comprising:
A) multiplier means for multiplying first and second input signals to produce a multiplier output signal;
B) a first amplifier means coupled with said multiplier means for amplifying said multiplier output signal to produce an amplified multiplier output signal;
C) summer means coupled with said first amplifier means for adding said amplified multiplier output signal and a mixer feedback signal to produce a sum signal;
D) second amplifier means coupled with said summer means for amplifying said sum output signal with a gain G to produce an amplified sum signal;
E) first filter means coupled with said second amplifier means and having a transfer characteristic $H_f$ for filtering said amplified sum signal to produce a mixer output signal applied to a mixer output line, said mixer output signal comprising a wanted component in a pre-selected band of interest, and an unwanted component outside said pre-selected band; and
F) second filter means coupled with said first filter means and said summer means, and having a transfer characteristic $H_o$, for filtering said mixer output signal to produce said mixer feedback signal and applying said mixer feedback signal to said summer means; and
G) wherein said amplifier means and first and second filter means cause said mixer feedback signal to be of an amplitude, frequency and phase that reduces said unwanted component of said mixer output signal.

25. The mixer in accordance with claim 24, wherein said wanted component falls within a pre-selected frequency band, and said unwanted component comprises an unwanted, near-DC component, and an unwanted component outside said pre-selected band; and wherein said G, $H_f$, and $H_o$ are selected such that said mixer feedback signal comprises:
  (i) approximately the same amplitude as, and approximately opposite polarity from that of, said unwanted near-DC component, and
  (ii) approximately the same amplitude and approximately the same frequency as said unwanted component outside said pre-selected band, and a phase that is about 180° out of synchronization therewith.

26. The mixer in accordance with claim 24, wherein the product of G, $H_f$, and $H_o$ is negative.

27. The mixer in accordance with claim 24, wherein said mixer feedback signal cancels said unwanted component.

28. An active filtering mixer comprising:
A) summer means for adding a first input signal, a second input signal, and a mixer feedback signal to produce a sum signal;
B) multiplier means coupled with said summer means and having a non-linear operating characteristic for converting said sum signal into a multiplier output signal having a non-linear dependence on the amplitude of said sum signal;
C) amplifier means coupled with said multiplier means for amplifying said multiplier output signal with a gain G;
D) first filter means coupled with said amplifier means and having a transfer characteristic $H_f$ for filtering said amplified multiplier output signal to produce a mixer output signal applied to a mixer output line, said mixer output signal comprising a wanted component in a pre-selected band, and unwanted, near-DC component, and an unwanted component outside said pre-selected band; and
E) second filter means coupled with said first filter means and said summer means, and having a transfer characteristic $H_o$, for filtering said mixer output signal to produce said mixer feedback signal and applying said mixer feedback signal to said summer means; and
F) wherein said amplifier means and first and second filter means cause said mixer feedback signal to be of an amplitude, frequency and phase that reduces said unwanted components of said mixer output signal.

29. The mixer in accordance with claim 28, wherein said G, $H_f$, and $H_o$ are selected such that said mixer feedback signal comprises:
  (i) approximately the same amplitude as, and approximately opposite polarity from that of, said unwanted near-DC component, and
  (ii) approximately the same amplitude and approximately the same frequency as said unwanted component outside said pre-selected band, and a phase that is about 180° out of synchronization therewith.

30. The mixer in accordance with claim 28, wherein the product of G, $H_f$, and $H_o$ is negative.

31. The mixer in accordance with claim 28, wherein said mixer feedback signal cancels said unwanted component.

32. An active filtering mixer comprising:
A) a non-linear summation device for adding a first input signal, a second input signal, and a mixer feedback signal to produce a sum signal;
B) amplifier means coupled with said non-linear summation device for amplifying said sum signal with a gain G;
D) first filter means coupled with said amplifier means and having a transfer characteristic $H_f$ for filtering said amplified multiplier output signal to produce a mixer output signal applied to a mixer output line, said mixer output signal comprising a wanted component in a pre-selected band, an unwanted, near-DC component, and an unwanted component outside said pre-selected band; and
E) second filter means coupled with said first filter means and said summer means, and having a transfer characteristic $H_o$, for filtering said mixer output signal to produce said mixer feedback signal and applying said mixer feedback signal to said summer means; and F) wherein said amplifier means and first and second filter means cause said mixer feedback signal to be of an amplitude, frequency and phase that reduces said unwanted component of said mixer output signal.

33. The mixer in accordance with claim 32, wherein said G, $H_f$, and $H_o$ are selected such that said mixer feedback signal comprises:
   (i) approximately the same amplitude as, and approximately opposite polarity from that of, said unwanted near-DC component, and
   (ii) approximately the same amplitude and approximately the same frequency as said unwanted component outside said pre-selected band, and a phase that is about 180° out of synchronization therewith.

34. The mixer in accordance with claim 32, wherein the product of G, $H_f$, and $H_o$ is negative.

35. The mixer in accordance with claim 32, wherein said mixer feedback signal cancels said unwanted component.

36. The mixer in accordance with claim 32, wherein said non-linear summation device comprises a diode.

37. A method of active filtering within a mixer, comprising the steps of:
   A) multiplying a first input signal and a second input signal in a multiplier to produce a mixer output signal, said mixer output signal having an unwanted first component and a wanted second component;
   B) supplying to the multiplier, out of phase, said unwanted first component as a feedback signal derived from said mixer output signal; and
   C) responsive to said feedback signal, attenuating said first component of said mixer output signal dynamically within said multiplier, thereby reducing the effects of said unwanted first component within the multiplier, and reducing multiplier-generated distortion in said mixer output signal.

38. The method of claim 37, further comprising the steps of:
   A) supplying to the multiplier, out of phase and to a smaller degree than said unwanted first component, said wanted second component as a linearizing component of said feedback signal, said linearizing component being derived from said mixer output signal, and
   B) responsive to said linearizing component, linearizing a selected frequency band of said mixer output signal in said multiplier with respect to said first and second input signals.

* * * * *